(12) United States Patent
Suzuki et al.

(10) Patent No.: US 8,089,205 B2
(45) Date of Patent: Jan. 3, 2012

(54) WIRING BOARD WITH GROOVE IN WHICH WIRING CAN MOVE, IMAGE DISPLAY APPARATUS, AND IMAGE REPRODUCING APPARATUS

(75) Inventors: Yoshio Suzuki, Isehara (JP); Kazuya Ishiwata, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 547 days.

(21) Appl. No.: 12/296,016

(22) PCT Filed: May 31, 2007

(86) PCT No.: PCT/JP2007/061494
§ 371 (c)(1),
(2), (4) Date: Oct. 3, 2008

(87) PCT Pub. No.: WO2007/145123
PCT Pub. Date: Dec. 21, 2007

(65) Prior Publication Data
US 2009/0161022 A1    Jun. 25, 2009

(30) Foreign Application Priority Data
Jun. 15, 2006   (JP) .................... 2006-166081

(51) Int. Cl.
*H01J 9/02* (2006.01)
*H01J 63/04* (2006.01)
*H05K 1/00* (2006.01)

(52) U.S. Cl. ........ 313/310; 313/496; 313/497; 174/250; 29/829; 29/846; 361/748

(58) Field of Classification Search .......... 313/495–497, 313/310; 174/250, 260; 29/829, 846, 847; 361/748, 760, 761, 765, 775, 779; 315/169.1, 315/169.2
See application file for complete search history.

(56) References Cited

U.S. PATENT DOCUMENTS

| | | | |
|---|---|---|---|
| 4,010,395 A | 3/1977 | Holz | |
| 5,429,670 A * | 7/1995 | Miyoshi | 106/1.18 |
| 5,977,698 A * | 11/1999 | Lee | 313/336 |
| 6,198,618 B1 * | 3/2001 | Ohtani et al. | 361/306.3 |
| 6,466,112 B1 | 10/2002 | Kwon et al. | |
| 6,653,232 B2 | 11/2003 | Uda et al. | 438/669 |
| 6,758,712 B2 | 7/2004 | Kubo et al. | 445/24 |
| 6,803,707 B2 | 10/2004 | Ishiwata et al. | 313/310 |
| 6,815,884 B2 | 11/2004 | Yamada et al. | 313/495 |
| 6,853,117 B2 | 2/2005 | Toshima et al. | 313/304 |

(Continued)

FOREIGN PATENT DOCUMENTS

JP    2002-203475 A2    7/2002

(Continued)

OTHER PUBLICATIONS

Machine translation of Sakamoto, JP 2004-342547A.*

(Continued)

*Primary Examiner* — Nimeshkumar Patel
*Assistant Examiner* — Steven Horikoshi
(74) *Attorney, Agent, or Firm* — Fitzpatrick, Cella, Harper & Scinto

(57) ABSTRACT

A wiring board has a substrate having a groove on its surface, a first wiring placed in the groove, a plurality of bonding members located at mutually separated positions and each of which bonds the first wiring and the substrate. A gap is located between the first wiring and the surface of the groove.

8 Claims, 5 Drawing Sheets

U.S. PATENT DOCUMENTS

| | | |
|---|---|---|
| 6,866,989 B2 | 3/2005 | Watanabe et al. ............. 430/394 |
| 6,902,455 B2 | 6/2005 | Yanagisawa et al. ........... 445/24 |
| 6,903,504 B2 | 6/2005 | Watanabe et al. ............. 313/495 |
| 7,064,475 B2 | 6/2006 | Kuroda et al. ................. 313/311 |
| 7,095,168 B2 | 8/2006 | Meguro et al. ................ 313/495 |
| 7,211,943 B2 | 5/2007 | Watanabe et al. ............. 313/495 |
| 7,285,428 B2 | 10/2007 | Uda et al. ........................... 438/4 |
| 7,318,996 B2 | 1/2008 | Watanabe et al. ............. 430/311 |
| 7,435,535 B2 | 10/2008 | Watanabe et al. ............. 430/311 |
| 7,442,404 B2 | 10/2008 | Kuroda et al. ................... 427/74 |
| 7,458,872 B2 | 12/2008 | Uda et al. ........................ 445/59 |
| 2004/0150310 A1* | 8/2004 | Azuma ........................ 313/249 |
| 2008/0001516 A1* | 1/2008 | Moriya et al. ................ 313/483 |
| 2008/0001517 A1* | 1/2008 | Moriya et al. ................ 313/483 |
| 2008/0005899 A1* | 1/2008 | Moriya et al. .................. 29/831 |

FOREIGN PATENT DOCUMENTS

| | | |
|---|---|---|
| JP | 2004342547 A * | 12/2004 |
| JP | 2006-66337 A2 | 3/2006 |

OTHER PUBLICATIONS

PCT Notification Concerning Transmittal of International Preliminary Report on Patentability (Chapter I of the Patent Cooperation Treaty) dated Dec. 31, 2008; International Preliminary Report on Patentability (Chapter I of the Patent Cooperation Treaty); Written Opinion of the International Searching Authority of International Application No. PCT/JP2007/061494.

XP-002456842, Product news 2004, "A Concrete Floor Heating Revolution", Ebeco Cable Board (1 sheet).

\* cited by examiner

WIRING BOARD WITH GROOVE IN WHICH WIRING CAN MOVE, IMAGE DISPLAY APPARATUS, AND IMAGE REPRODUCING APPARATUS

CROSS REFERENCE TO RELATED APPLICATIONS

This Application is a National Stage filing under 35 U.S.C. §371 of International Application No. PCT/JP2007/061494, filed May 31, 2007, and claims priority to Japanese Patent Application No. 2006-166081, filed Jun. 15, 2006, which is incorporated by reference herein in its entirety, as if set forth fully herein.

BACKGROUND OF THE INVENTION

1. Field of the Invention

The present, invention relates to a wiring board having a wiring placed on a substrate, an electron source using the wiring board, an image display apparatus, and an image reproducing apparatus.

2. Description of the Related Art

Flat panel displays such as an LCD (liquid crystal display), a PDP (plasma display), and an FED (field emission display) are display apparatuses in which a lot of pixels are arranged into a plane state. Most of such display apparatuses have a wiring board provided with a plurality of wirings (X-directional wirings or Y-directional wirings) on a substrate made of glass. Some of the display apparatuses are provided with a plurality of wirings (Y-directional wirings or X-directional wirings) which cross the wirings on the substrate. Wirings are, generally, formed by applying or depositing a conductive material to or on the surface of a substrate.

Conventionally, X-directional wirings and Y-directional wirings are formed by laminating them on the smooth surface of a substrate. As high definition of displays develops, a space allowed for one pixel is required to be further reduced. In such case, if wirings are simply thinned, wiring resistance rises, and thus the thickness of the wirings for securing a conductive sectional area should be enlarged. On the other hand, when the wirings become too thick, the thickness (height) of the wirings themselves occasionally becomes a problem. Particularly in displays using an electron-emitting device such as field-emitting type and surface-conductive type ones, a trajectory of electrons emitted from the electron-emitting device is occasionally influenced by the shape of peripheral structures (for example, wirings) and an electric potential, the wirings need to be as low as possible. For this reason, a method for forming wirings in a groove which is obtained by digging down the surface of a substrate formed with the electron-emitting device is considered.

SUMMARY OF THE INVENTION

FIGS. 5A and 5B are diagrams schematically illustrating a state that grooves 200 placed on the surface of a substrate 100 are filled with wirings 300 without a gap. FIG. 5A is a plan view, and FIG. 5B is a sectional view along line B-B of FIG. 5A. As shown in FIG. 5B, when the grooves 200 are completely filled with the wirings 300, cracks 400 are occasionally generated on the substrate 100. One factor of the cracks 400 is a difference between a thermal expansion coefficient of the material of the substrate 100 (substrate material) and a thermal expansion coefficient of the filling material in the grooves 200 (groove-filling material) as the material of the wirings 300. This tendency appears prominently and particularly in the case where conductive paste is applied to completely fill the grooves 200 and is baked according to a printing method. When the wirings 300 are formed and a display apparatus is driven, the temperature of the substrate 100 and the filling material in the groove 200 greatly rises. In this case, the filling material in the grooves 200 expands and constricts so as to push or draws the inner walls of the grooves 200, thereby causing the cracks 400 on the substrate 100. In general, since the filling material in the grooves 200 is metal and the substrate is made of glass, the thermal expansion coefficient of the filling material is larger than the thermal expansion coefficient of the material, of the substrate 100.

The inventors of this invention consider that the shape of the grooves and the strength of a bonding force between the substrate material and the filling material in the grooves cause cracks.

The condition which prevents cracks is not found out clearly. In the case where a glass substrate whose thermal expansion coefficient is about 8 to $9 \times 10^{-6}$ and a filling material in grooves whose main component Ag has a thermal expansion coefficient of $19 \times 10^{-6}$ are used, the difference in the thermal expansion coefficients becomes large. As a result, the probability that cracks are generated becomes high. For this reason, the degree of material selecting flexibility becomes low, and thus structural design should be schemed.

The object of the present invention is to provide a wiring board which represses the generation of cracks.

(1) In order to achieve the above object, a wiring board of the present invention includes a substrate having a groove on its surface, a first wiring at least whose part is placed in the groove, and a plurality of insulating layers located at mutually separated positions. A gap is located between the first wiring and the surface of the groove. Each of the insulating layers connects the first wiring and the substrate.

(2) An electron source of the present invention includes the wiring board described in (1), and an electron-emitting device placed on the wiring board. The electron-emitting device is connected to the first wiring and the second wiring placed on the insulating layer.

(3) The present invention is an image display apparatus that includes an electron source, and a luminescent member which emits light by irradiation of electrons emitted from the electron source thereto. The electron source is the electron source of described in (2).

(4) The present invention is an image reproducing apparatus which includes at least a receiver which receives at least one of a broadcasting signal and a signal routed through an electric communication line, and an image display apparatus connected to the receiver. The image display apparatus is the image display apparatus described in (3).

According to the present invention, the generation of cracks on the substrate can be repressed.

DESCRIPTION OF THE EMBODIMENTS

Exemplary embodiments of the present invention are described in detail below with reference to the drawings. Dimensions, materials, shapes, and relative arrangement of components described in the embodiments are not limited to the scope of the present invention unless otherwise noted. The wiring board of the present invention can be applied to LCD, PDP, and FED. The other function elements are connected to wirings of the wiring board of the present invention so that various electron devices can be constituted.

Figure 1A:
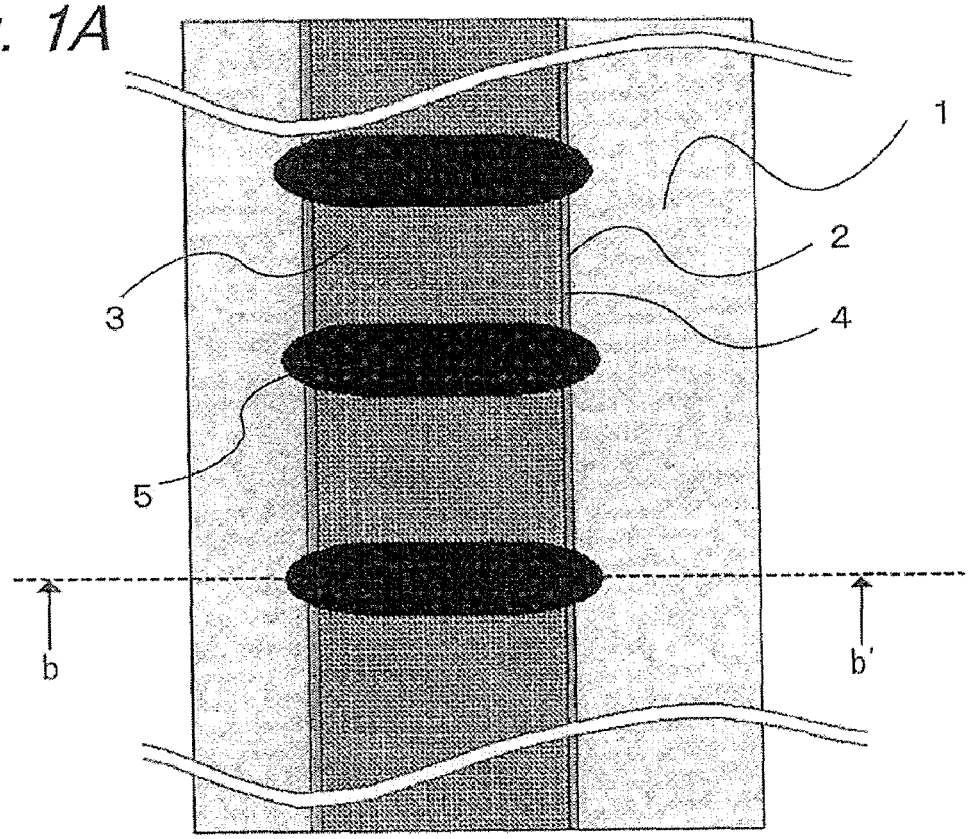
FIGS. 1A and 1B are a plan view and a sectional view illustrating characteristics of a wiring board in an embodiment.
Figure 1B:
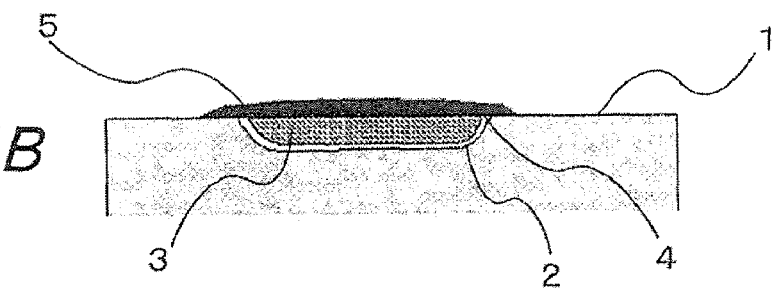

FIG. 1A is a plan view schematically illustrating characteristics of the wiring board in this embodiment and FIG. 1B is a sectional view of a broken-line portion. FIG. 1B is a sectional pattern diagram along b-b' of FIG. 1A.

In FIGS. 1A and 1B, the wiring board has a substrate 1 having a groove 2 on its surface, a first wiring 3 at least whose part is arranged in the groove 2, and a plurality of bonding members 5 which bond the first wiring 3 and the substrate 1 at a plurality of mutually separated places. A gap 4 is provided between the first wiring 3 and the surface of the groove 2, and the plurality of bonding members 5 connect the first wiring 3 and the substrate 1 to exceed the gap 4. The bonding members 5 may be any conductive materials as long as they can bond the first wiring 3 and the substrate 1, and the material is not particularly limited. An insulating material is, however, preferably used because it represses an electric influence on the first wiring 3. The plurality of bonding members 5 are arranged on the surface of the substrate 1 near the first wiring 3 and the groove 2, but the bonding members 5 may be arranged in the groove 2. In order to secure the insulation between a second wiring 9 and the first wiring 3, however, it is preferable that the bonding members 5 are layers (insulating layers) made of an insulating material and are arranged to cover a part of the first wiring 3 and a part of the substrate 1. For this reason, the following describes the case where an insulating layer is used as the bonding members 5. It is particularly preferable to use glass with excellent workability as the substrate 1, but an insulating material other than glass can be used. It is preferable that the surface of the substrate 1 has a practically flat plane except for the groove 2.

The groove 2 is provided by digging the surface of the substrate 1. The first wiring 3 whose main component is a conductive material is formed in the groove 2. A metal material is typically used as the conductive material.

The gap 4 is provided between the first wiring 3 and the surface of the groove 2. The plurality of insulating layers 5 bond (fasten) the first wiring 3 and the substrate 1 exceeding the gap 4 in a direction which crosses a direction where the first wiring extends. As a result, the first wiring 3 is fixed into the groove 2. FIGS. 1A and 1B illustrate a state that the substrate 1 and the first wiring 3 are separated in the groove 2. The present invention, however, does not exclude the mode that the glass substrate 1 comes in contact with the first wiring 3 in some places in a section which is parallel with the section b-b' and different from the section b-b' (for example, a place which is not covered with the insulating layers 5). For example in FIG. 1B, at least any one of the left side, right side, and the bottom portion of the first wiring 3 possibly comes in contact with the surface of the groove 2. In the present invention, however, it is preferable that the wiring 3 is separated from the surface of the groove 2 in as many places as possible. The plurality of insulating layers 5 are separated from each other, and practically their gaps are preferably set to be larger than ½ of the width of the groove 2. In such a mode, the surface of the groove 2 and the first wiring 3 are not firmly fastened, and the first wiring 3 and the substrate 1 are not fastened except the bonding by the insulating layers 5 provided at gaps. For this reason, even if the first wiring 3 expands or constricts in the groove 2, an adverse influence on the surface of the substrate 1 due to the expansion and constriction of the wiring 3 (generation of cracks) can be reduced. In other words, in the present invention, the first wiring 3 and the surface of the groove 2 (the inner wall of the groove 2) are not practically fastened and the substrate 1 and the first wiring 3 are fastened via the insulating layers 5. For this reason, the wiring 3 can move in the groove 2. Therefore, the most ideal constitution of the wiring board in the present invention is such that the wiring 3 does not come in contact with the surface of the groove 2 (the surface of the substrate 1 positioned in the groove 2) and is fixed to the substrate 1 by the insulating layers 5.

Figure 2A:
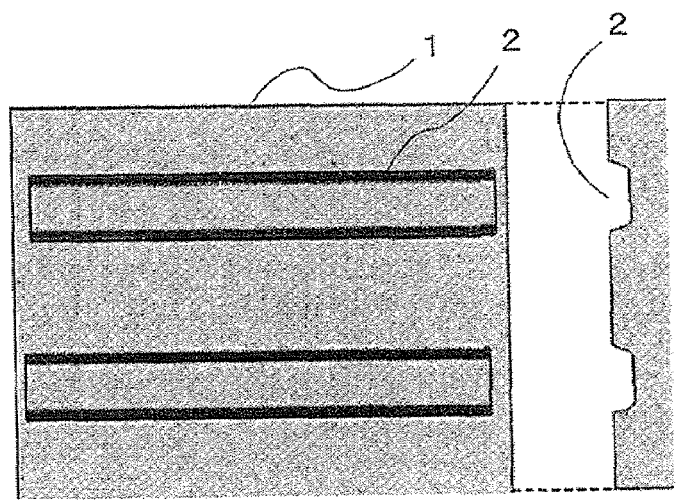
FIGS. 2A, 2B, and 2C are basic process diagrams for realizing a constitution of the present invention.
Figure 2B:
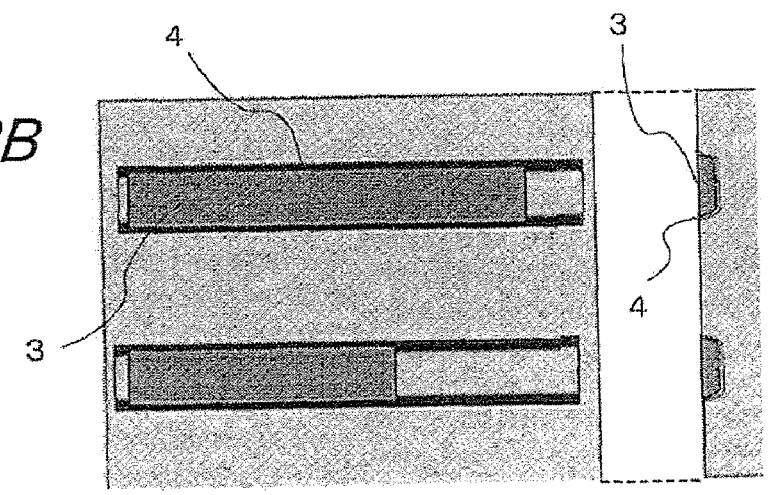
Figure 2C:
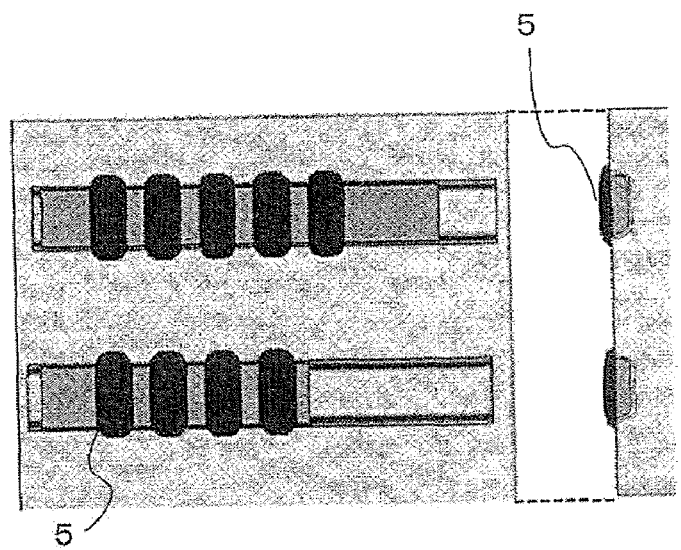

FIGS. 2A to 2C are diagrams illustrating basic steps for realizing the constitution of the present invention. One example of the manufacturing steps for the wiring board in this embodiment is described with reference to FIGS. 2A to 2C. Right sides in the respective drawings are sectional views in the plan views shown on the left side.

(Step 1) The groove 2 is formed on the surface of the glass substrate 1 by, for example, a sandblasting method (FIG. 2A). A resist pattern for sandblasting is formed on the glass substrate 1 in advance. The groove 2 having width of 50 to 300 μm is formed by the sandblasting method. The sandblasting condition is controlled so that the depth of the groove can be adjusted to 10 to 100 μm. The substrate having a flat surface is prepared and the groove 2 is provided by processing this surface, but the present, invention is not limited, to this. For example, a substrate material is poured into a mold for forming the groove 2, and the substrate 1 having the groove 2 can be prepared. However, since fine unevenness is formed in the groove 2 formed by the sandblasting method, an area of contact between the wiring 3 and the surface of the groove 2 at the time of the thermal expansion and constriction of the wiring 3 can be reduced. Therefore, this blasting method is preferable.

(Step 2) After the groove 2 formed at step 1 is filled with Ag paste (silver paste) as a material of the first wiring 3 by a screen printing method, the solvent is dried and evaporated at 80 to 120° C. Thereafter, the glass substrate 1 filled with the Ag paste is baked at 400 to 500° C. At this time, when the Ag paste whose frit component content is small is used, the wiring 3 is easily peeled from the surface of the groove 2 (the inner wall of the groove 2) at the time of baking the paste, so that the gap 4 is formed between the first wiring 3 (Ag wiring) and the surface of the groove 2 (FIG. 2B).

The metal paste includes not only Ag paste containing Ag particles but also metal paste containing Cu (copper) particles and Ni (nickel) particles as long as a oxygen partial pressure is controlled at the baking step. The first wiring 3 formed at step 2 is peeled from the surface of the groove 2 very easily in the groove 2.

(Step 3) In this embodiment, the plurality of the insulating layers 5 as a glass material whose softening point is lower than a melting point of the substrate 1 (in the case of the glass substrate, a softening point) are formed discretely (separated from each other). As a result, the first wiring 3 is fixed into the groove 2 in a state that the gap 4 is maintained. Each of the insulating layers 5 can be formed by applying the insulating paste to predetermined portions and baking it. Concretely, an insulating paste material containing lead oxide or bismuth oxide (low-melting point glass paste mainly containing glass having glass transition temperature of 600° C. or less) is prepared. The insulating paste is printed in the predetermined places (a plurality of places) by a screen printing method, for example, and after the solvent is dried at 80 to 120° C., it is baked at 400 to 500° C. As a result, the plurality of the insulating layers 5 are formed discretely.

The basic constitution is formed at steps 1 to 3, but generally other steps are inserted before and after and between the steps so as to be used as a part of a more complicated structure, in the following embodiments, the constitution is described in more detail.

EMBODIMENTS

FIGS. 3A to 3K are diagrams illustrating a more concrete manufacturing process for the wiring board and the electron source in the first and second embodiments.

First Embodiment

FIGS. 3A to 3H are diagrams illustrating the manufacturing process for the wiring board and the electron source in this embodiment. The first embodiment is described below with reference to FIGS. 3A to 3H.

(Step 1: Forming of First Electrode 6 and Second Electrode 7)

Figure 3A:
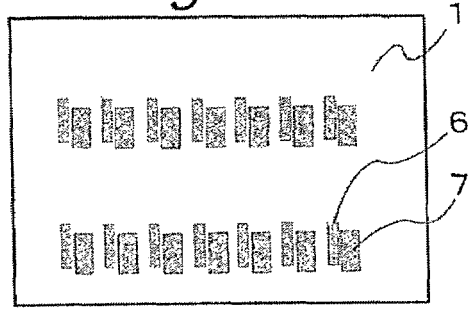
FIGS. 3A, 3B, 3C, 3D, 3E, 3F, 3G, and 3H are diagrams illustrating the processes for manufacturing the wiring board and an electron source in a first, embodiment.

A Pt thin film is deposited entirely on the glass substrate 1 (PD200 made by Asahi Glass Co., Ltd.), and patterning is carried out by a photolithography method, so that a lot of electrode pairs (units) composed of the first electrode 6 and the second electrode 7 are formed into a matrix pattern (FIG. 3A). In each unit, the first, electrode 6 and the second electrode 7 are provided so as to be separated from each other.

(Step 2: Forming of Groove 2)

Figure 3E:
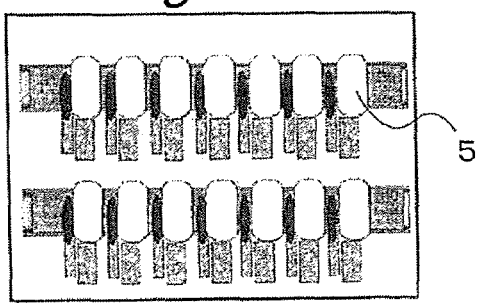
Figure 3B:
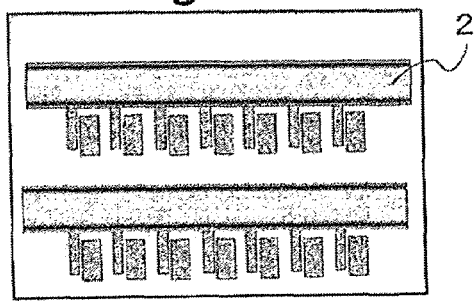

A resist pattern is formed on a portion where the groove 2 is not formed by a sandblasting resist according to the photolithography method, and a portion of the glass substrate 1 which is not covered with the resist is scraped by the sandblasting method so that the groove 2 is formed (FIG. 3B). The width of the groove 2 in this embodiment is 280 μm, and the depth is 60 μm at its center portion. Step 2 can be executed before step 1.

(Step 3: Forming of Ag Wiring)

The Ag paste is dropped into the groove 2 so as to be printed by the screen printing method. Thereafter, the solvent is dried at 80 to 120° C. and is baked at peak temperature of 480° C. in the atmosphere, so that the first wiring 3 (Ag wiring (X-directional wiring)) is formed (FIG. 3C). At this time, the content of the glass frit component in the Ag paste is set to not less than 0.2 wt % to less than 1 wt % with respect to Ag in the Ag paste (in this embodiment, 0.8 wt %). As a result, the first wiring 3 is separated from the surface of the groove 2 at the time of baking and constriction of the Ag material, and the gap 4 of not less than 5 μm to not more than 20 μm is formed. The filling amount of the Ag paste is adjusted so that the thickness of the baked first wiring 3 is equivalent to the depth of the groove 2. The first wiring 3 mainly contains Ag, but the main component of the first wiring 3 is not limited to Ag and various metal materials such as Cu and Ni can be used.

(Step 4: Forming of Connecting Electrode 8)

The Ag paste is printed by the screen printing method in order to connect the first: electrode 6 and the first wiring 3 using the Ag paste. The Ag paste is printed on the first wiring 3 and the first electrode 6 across the gap 4. Thereafter, the solvent of the Ag paste is dried and baked, and a connecting electrode 8 for connecting the first wiring 3 and the first electrode 6 is formed (FIG. 3D). Step 4 is provided after step 3, but it may be provided between step 2 and step 3. In this case, the connecting electrode 8 is formed so as to extend from the groove 2, and the groove 2 is filled with the Ag paste at step 3, so that the connecting electrode 8 and the Ag wiring 2 may be connected. The connecting electrode 8 should be bonded to the first wiring 3 and the first electrode 6. For this reason, the content of glass frit in the Ag paste for the connecting electrode 8 is not less than 1 wt %.

(Step 5: Forming of Insulating Layer 5)

An insulating paste mainly containing bismuth oxide is printed with length of 100 μm, width of 300 μm, thickness of 30 μm, pitch of 280 μm (interval of adjacent insulating layers 5) by the screen printing method so as to cover the first wiring 3 and the surface of the glass substrate 1 positioned on both sides of the grooves 2. After the printing, the solvent is dried and is baked in the atmosphere, so that a lot of insulating layers 5 are formed discretely (separated from each other) (FIG. 3E). At this step, the first wiring 3 is fixed into the groove 2 by the insulating layers 5 without giving an adverse effect to the substrate 1 even if its volume fluctuates at the time of thermal expansion and constriction. The plurality of insulating layers 5 are formed so as to be separated from each other in a longitudinal direction of the first wiring 3 (a right-left direction in FIG. 3), so that the fluctuation in the volume due to heat can be absorbed in the portions which are not covered with the insulating layers 5. Each of the insulating layers 5 extends to a direction which crosses the first wiring 3, and covers the first wiring 3 and the surface of the glass substrate 1 positioned on both sides of the first wiring. When a lot of the insulating layers are formed in such a manner, damage to the substrate 1 at the time of the thermal expansion and constriction of the wiring 3 can be reduced. With such a constitution of the insulating layers 5, in the case where a second wiring 9 which crosses the first wiring 3 is formed on the insulating layers 5, if the second wiring 9 is formed by the printing method, a conductive paste for forming the second wiring 9 enters the groove 2, so that short-circuit of the first wiring and the second wiring 2 can be repressed.

(Step 6: Forming of Second Wiring 9)

Figure 3F:
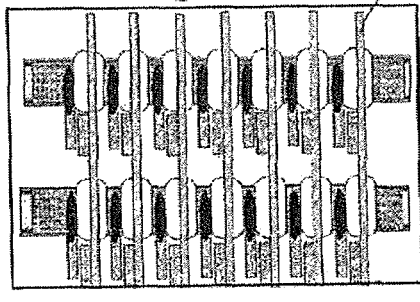
Figure 3C:
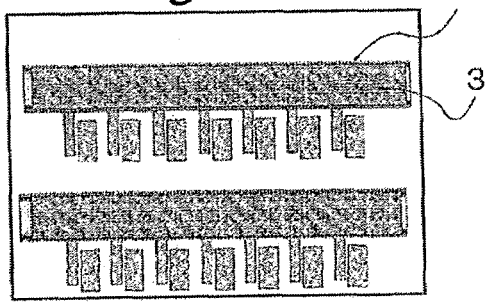

The Ag paste is printed into a predetermined shape and is baked by the screen printing method, so that the second wiring (Y-directional wiring) 9 is formed on the insulating layers 5 in a direction which crosses the wiring 3 (FIG. 3F). At this time, the second wiring 9 crosses the first wiring 3 in a state that they are insulated by the insulating layers 5 formed at step 5, and is connected to a part of the electrode 7.

(Step 7: Forming 1 of Electron-Emitting Device)

Figure 3G:
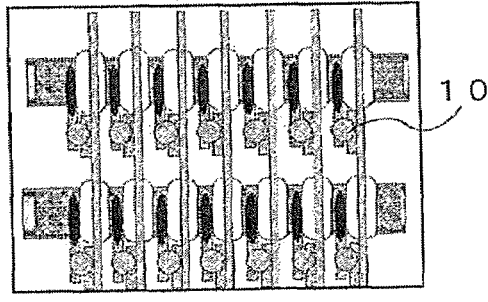
Figure 3D:
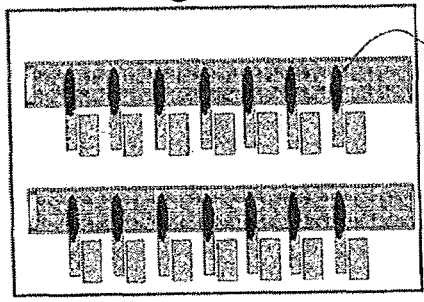

After an organic palladium-contained solution is applied by an ink-jet method so that the first electrode 6 is connected to the second electrode 7, a heating and baking process is carried out so that a conductive film 10 made of palladium oxide is formed (FIG. 3G). The method for forming the conductive film 10 is not limited to the ink-jet method, and well-known film depositing methods can be adopted.

(Step 8: Forming 2 of Electron-Emitting Device)

Figure 3H:
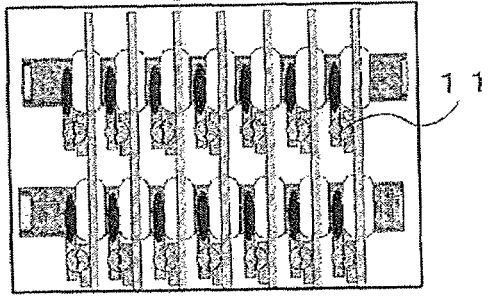

Thereafter, a voltage is applied between the wiring 3 and the wiring 9 in an atmosphere (vacuum) whose pressure is lower than atmospheric pressure, so that a gap 11 is formed on the conductive film 10 (FIG. 3H). Thereafter, a publicly-known activating process is executed.

The wiring board is manufactured at steps 1 to 6. A plurality of surface-conduction type electron-emitting devices is provided on the wiring board at steps 7 and 8, so that the electron source can be manufactured.

In the wiring board manufactured in this embodiment, heating and cooling were repeated in a test, but cracks were not generated in the glass substrate 1, and the first wiring 3 was not peeled from the glass substrate 1. In the manufacturing process of the wiring 3, 9, the insulating layer 5, the connecting film 10, heating and cooling process were repeated, but cracks were not generated in the glass substrate 1.

Second Embodiment

A second embodiment is described below.

In this embodiment, Ag paste which is used for the first wiring 3 in the first embodiment and whose glass frit content is changed is used, and (step 1) to (step 5) in the first embodiment are executed. Conditions of a sintered object (wiring 3) formed in the groove 2 and the groove 2 are observed.

TABLE 1

| Type of Ag paste | Glass frit content (in solid content) | Bonding to inner wall of the groove (Existence of gap) | Occurrence of crack on substrate glass |
|---|---|---|---|
| Paste A | 0.3 wt % | Gap of 5 to 20 μm | No crack |
| Paste B | 1 wt % | No gap | Crack |
| Paste C | 10 wt % | No gap | Crack |

Figure 5A:
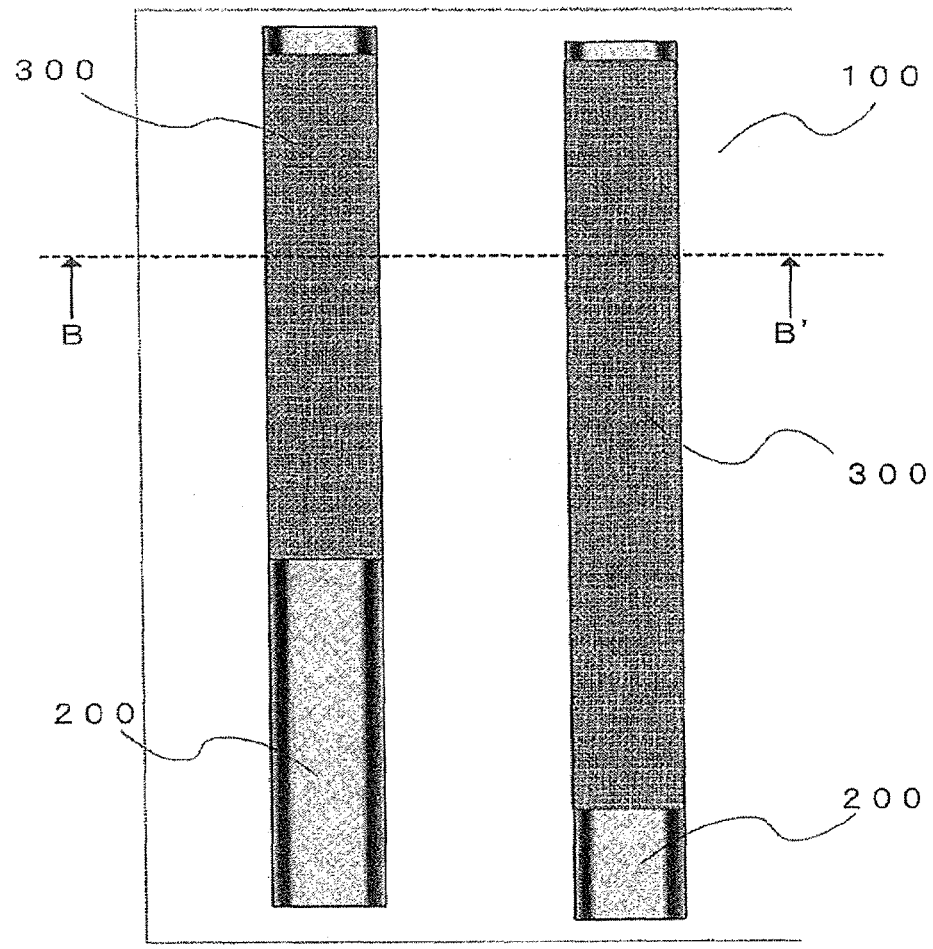
FIGS. 5A and 5B are a plan view and a sectional view illustrating a conventional example.
Figure 5B:
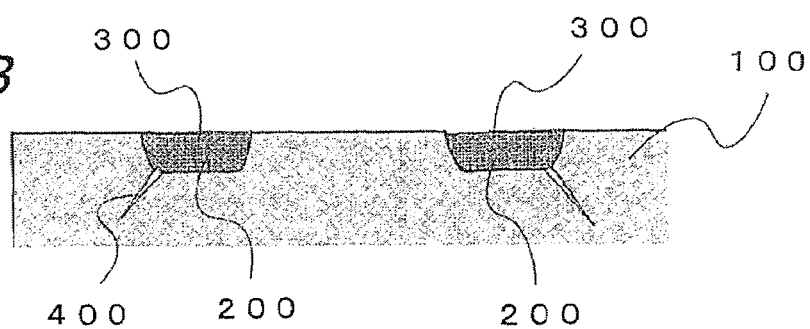

The Ag paste whose content of the glass frit component is increased strengthens the bonding force between the surface of the groove 2 (inner wall of the groove 2) and the surface of the glass substrate 1, but transmits a stress due to thermal expansion and constriction of the Ag material directly to the surface of the glass substrate 1. For this reason, the case where the cracks shown by 400 in FIG. 5B are generated in the glass substrate 1 is observed.

The generation of cracks is not always determined only by the glass frit content. The content of glass frit, component as solid component included in the finally obtained, wiring 3 is repressed to less than 1 wt % based on another experimental results or the like. As a result, the strong bonding force of the surface of the glass substrate is not generated under most of the wiring board manufacturing conditions (cracks are not generated), and the gap 4 is formed between the wiring and the surface of the groove 2. The content of the solid component is substantially equivalent to the content in the finally obtained wiring 3. For example, the Ag paste contains a solvent or the like, and since the solvent is substantially destroyed by the baking process at the time of obtaining the wiring 3, the finally obtained wiring 3 does not substantially contain the solvent. A member which is destroyed, and does not finally remain in the wiring 3 at the process for obtaining the wiring 3 such as the baking does not correspond to "the solid component".

When the glass frit content is reduced, the amount of Ag particles in the Ag paste increases. As a result, specific resistance of the Ag wiring is further reduced. Practically when the content of the glass frit is less than 0.2 wt %, it is difficult to bind the Ag particles and maintain the form of the wiring, and thus the function of the wiring is greatly deteriorated. For this reason, it is practically preferable that the content of the glass frit in the sold component contained in the paste set to not less than 0.2 wt % to less than 1 wt %. The above range of the glass frit content is applied not only to the Ag paste but also to conductive paste using other metal particles (for example, Cu particles).

Third Embodiment

Figure 4:
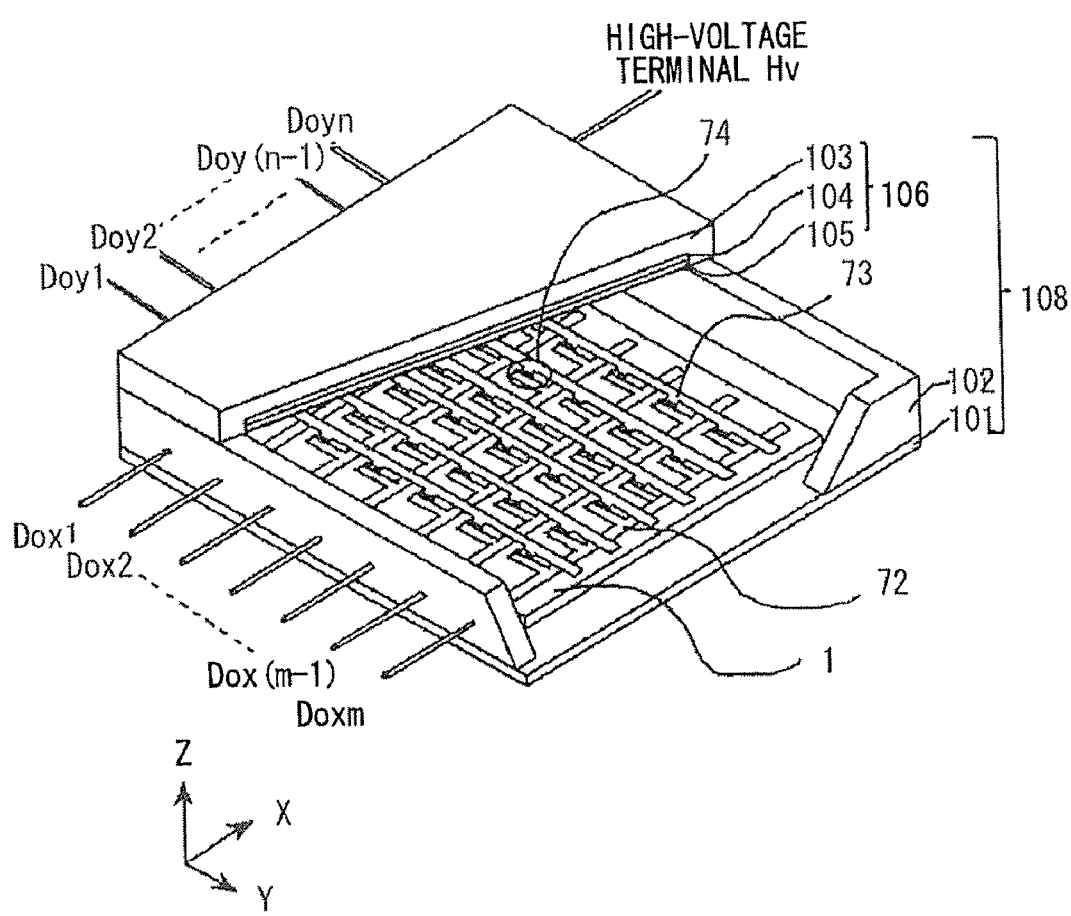
FIG. 4 is a schematic constitutional perspective view illustrating an image forming apparatus according to the embodiment of the present invention.

In the third embodiment, the electron source manufactured in the first, embodiment and a face plate substrate are arranged in an opposing manner, and a flat panel display 108 shown in FIG. 4 (corresponding to the "image display apparatus" of the present invention) is manufactured.

A face plate substrate 106 is arranged 4 mm above the electron source manufactured in the first embodiment via a supporting frame 102, and frit glass is applied to respective joint portions of the face plate substrate 106, the supporting frame 102, and the electron source, and is sealed. The face plate substrate 106 includes a luminescent film 104 (corresponding to the "luminescent member" of the present invention) and a metal back 105 which are on an inner surface of a glass substrate 103. The luminescent film 104 emits light by emitting electrons discharged from the electron source thereto.

In FIG. 4, 74 designates an electron-emitting device, 72 and 73 designate an X-directional wiring and a Y-directional wiring.

In the image display apparatus in this embodiment, the respective electron-emitting devices emit electron beams in such a manner that a signal generating unit (not shown) applies a scanning signal and a modulating signal thereto via out-of-container terminals Dox1 to Doxm and Doy1 to Doyn. A high voltage of not less than 10 kV is applied to the metal back 105 from a high voltage terminal Hv so that the electron beams are accelerated and are allowed to collide with the luminescent film 104, and the luminescent film 104 is excited and emits light. As a result, an image is displayed.

A receiver which receives a broadcasting signal is connected to the flat display apparatus, or a communicator which transmits/receives a signal via an electric communication line such as an internet is connected to the flat display apparatus by a radio network, a telephone network, a digital network, an analog network, and a TCP/IP protocol. As a result, an image reproducing apparatus which executes a signal process so as to reproduce a television image and information received via the internet can be provided.

According to the present invention, in the structure where the first wiring is provided in the groove obtained, by digging the surface of the glass substrate, the gap is located between the surface of the groove and the first wiring, and the insulating layers are fixed discretely to a wiring direction of the first wiring. As a result, the generation of cracks on the substrate surface caused, by a difference in the linear thermal expansion coefficient between the wiring material and the substrate can be repressed. Further, the first wiring can be fixed to the substrate sufficiently from practical perspective.

While the present invention has been described with reference to exemplary embodiments, it is to be understood that the invention, is not limited to the disclosed exemplary embodiments. The scope of the following claims is to be accorded the broadest interpretation so as to encompass all such modifications and equivalent structures and functions.

This application claims the benefit of Japanese Patent Application No. 2006-166081, filed Jun. 6, 2006, which is hereby incorporated by reference herein in its entirety.

What is claimed is:

1. A wiring board comprising:
   a substrate having a groove on a surface thereof;
   a first wiring placed in the groove; and
   a plurality of bonding members which are located at mutually separated positions and each of which bonds the first wiring and the substrate, wherein
   a gap is located between the first wiring and the surface of the groove so that the first wiring can move in the groove, and
   the first wiring is formed by baking a paste containing Ag particles and a glass frit component of not less than 0.2 wt % and less than 1 wt % in a solid component contained in the paste, and the bonding members are formed by baking a glass paste whose softening point is lower than a melting point of the substrate.

2. A wiring board according to claim 1, wherein each of the bonding members is an insulating layer composed of an insulating bonding member.

3. A wiring board according to claim 2, wherein each of the insulating layers covers a part of the first wiring and a part of the substrate in a direction crossing the first wiring.

4. A wiring board according to claim 2 further comprising:
a second wiring which crosses the first wiring,
wherein the second wiring is located on the insulating layers.

5. A wiring board according to claim 1, wherein the gap is not less than 5 microns and not more than 20 microns.

6. An electron source comprising:
the wiring board according to claim 1; and
an electron-emitting device placed on the wiring board,
wherein the electron-emitting device is connected to the first wiring.

7. An image display apparatus comprising:
the electron source according to claim 6; and
a luminescent member which emits light by irradiation of electrons emitted from the electron source thereto.

8. An image reproducing apparatus comprising:
a receiver which receives at least one of a broadcasting signal and a signal routed through an electric communication line; and
the image display apparatus according to claim 7,
wherein the image display apparatus is connected to the receiver.

* * * * *